United States Patent [19]

Williams et al.

[11] Patent Number: 4,632,776

[45] Date of Patent: Dec. 30, 1986

[54] AMBIENT-PRESSURE ORGANIC SUPERCONDUCTOR

[75] Inventors: Jack M. Williams, Downers Grove; Hsien-Hau Wang, Willowbrook; Mark A. Beno, Woodridge, all of Ill.

[73] Assignee: The United States of America as represented by the United States Department of Energy, Washington, D.C.

[21] Appl. No.: 853,324

[22] Filed: Apr. 18, 1986

Related U.S. Application Data

[62] Division of Ser. No. 738,808, May 29, 1985.

[51] Int. Cl.[4] ............................................... H01B 1/06
[52] U.S. Cl. .................................... 252/518; 252/512; 428/470
[58] Field of Search .................... 252/518, 512; 549/3; 428/470; 73/8, 808; 174/68, 126 S, 128 S Primary Examiner—Josephine L. Barr
Attorney, Agent, or Firm—William Lohff; James W. Weinberger; Judson R. Hightower

[57] ABSTRACT

A new class of organic superconductors having the formula $(ET)_2MX_2$ wherein ET represents bis(ethylenedithio)-tetrathiafulvalene, M is a metal such as Au, Ag, In, Tl, Rb, Pd and the like and X is a halide. The superconductor $(ET)_2AuI_2$ exhibits a transition temperature of 5 K which is high for organic superconductors.

4 Claims, No Drawings

AMBIENT-PRESSURE ORGANIC SUPERCONDUCTOR

CONCEPTUAL ORIGIN OF THE INVENTION

The U.S. Government has rights in this invention pursuant to Contract No. W-31-109-ENG-38 between the U.S. Department of Energy and The University of Chicago representing Argonne National Laboratory.

This is a division of application Ser. No. 738,808 filed May 29, 1985.

BACKGROUND OF THE INVENTION

This invention relates to electrical conductors based on organic structures and more particularly to organic superconductors with improved transition temperatures at ambient pressure.

Electrical conductors based on organic structures and particularly organic superconductors represent a relatively new area of development compared to the metallic counterparts. While some metallic superconductors such as niobium and alloys of niobium have been used commercially for fabricating coils for supermagnets, organic superconductors are in a relatively early stage of development. Organic superconductors have been in general referred to as organic metals or synthetic metals because they have metal-like electrical conductivity which does not derive from the electrons of metal atoms. They also may be varied in structure by changes in composition and in general have a lower density than the metallic superconductors.

The first organic superconductor was $(TMTSF)_2X$ where TMTSF is the selenium-based organic donor tetramethyltetraselenafulvalene and X is a complex univalent anion such as $ClO_4^-$ or $PF_6^-$. The superconducting properties of these salts were first observed in 1980. These salts are now identified as Bechgaard salts.

In general, the Bechgaard salts undergo metal-to-insulator transitions as temperatures are decreased. For some of the Bechgaard salts, these transitions may be suppressed by applied pressures of several thousands of atmospheres to achieve a superconducting state near 1 K. In 1981, Bechgaard and coworkers reported that $(TMTSF)_2ClO_4$ exhibits ambient-pressure superconductivity with a transition temperature of about 1.2 K.

A more recent cation donor which produces organic superconductors is BEDT-TTF or ET which represents bis(ethylenedithio)tetrathiafulvalene. With $ClO_4^-$ as the anion in $(ET)_2ClO_4(C_2H_3Cl_3)_{0.5}$, the material reportedly has metallic conductivity but is not superconducting down to T=1.4 K. $(ET)_2ReO_4$ is reportedly superconducting at 4000 atmospheres with a transition temperature of about 2 K. When the anion $(I_3^-)$ was substituted by Russian researchers to produce $\beta$-$(ET)_2I_3$, superconductivity at ambient pressure was achieved near 1.4 K. Subsequently, $\beta$-$(ET)_2IBr_2$ was prepared which exhibits a transition temperature of 2.7 K.

One difference between these compositions was the reduction by about 7% in the total length of the anion (trihalide). This difference was expected to decrease the size of the unit cell in $\beta$-$(ET)_2IBr_2$ and increase the sulfur atom orbital overlap. The orbital overlap in the sulfur atom network constitutes the conductive band in these ET-based organic metals. Arguments based on increased overlap would predict a lower transition temperature for $\beta$-$(ET)_2IBr_2$. When a higher temperature was observed, the results were somewhat surprising. Subsequently, in the hope of achieving a higher $T_c$, a smaller anion derivative, $(ET)_2ICl_2$, was synthesized but exhibited no superconducting properties.

While the above work has provided significant results, it is of particular importance to increase transition temperatures to at least above the boiling temperature of helium (4.2 K). Helium could then be used to control the operating temperature of the organic superconductor.

Accordingly, one object of the invention is new organic superconductors. A second object of the invention is organic superconductors with increased transition temperatures. Another object of the invention is organic superconductors with a transition temperature above 4.2 K. These and other objects will become apparent from the following description.

SUMMARY OF THE INVENTION

Briefly, the invention relates to new organic superconductors having the formula $(ET)_2MX_2$ wherein ET represents bis(ethylenedithio)tetrathiafulvalene, M is a metal, X is a halide and the metal is selected so that the anion length of $MI_2$ is between that of $I_3$ and $IBr_2$. Suitably, the metal is Au, Ag, In, Tl, Rb, Pd and the like and preferably is Au. The halide includes iodide, bromide and chloride and preferably is iodide. Further, $MX_2$ preferably is symmetrical such as I-M-I. The composition $\beta$-$(ET)_2AuI_2$ has been found to have a transition temperature of 5 K which may be the first ambient pressure organic superconductor with a transition temperature as high as 5 K.

DETAILED DESCRIPTION OF THE PREFERRED EMBODIMENT

The invention is directed to a class of organic compositions represented by the formula $\beta$-$(ET)_2MX_2$ wherein ET is bis(ethylenedithio)tetrathiafulvalene, M is a metal, X is a halide and the anion length of $MI_2$ is between that of I-I-I and Br-I-Br. The $\beta$ form of $(ET)_2MX_2$ is used and it is also preferred that the anion be symmetrical. The metal includes Au, Ag, In, Tl, Rb, Pd and the like and preferably is Au. The halide has an atomic number in the range of 17-53 such as iodide, bromide and chloride and preferably is iodide. Other preferred compounds are: $(ET)_2InI_2$, $(ET)_2TlI_2$, $(ET)_2TlBr_2$, $(ET)_2TlCl_2$ and $(ET)_2AgI_2$. Particularly preferred is $\beta$-$(ET)_2AuI_2$. Anion lengths for determining the atom combinations may be determined in such references as Inorganic Chemistry, James E. Huheey, Harper and Row-Publishers, (1972) pp. 184–185.

The procedure used to prepare $(ET)_2MX_2$ involves two steps: the chemical synthesis of n-$Bu_4NMX_2$ and the electrocrystallization of $(ET)_2MX_2$ by using ET as an organic donor and n-$Bu_4NMX_2$ as supporting electrolyte. The anion $MX_2^-$ is synthesized by refluxing MX with n-$Bu_4NX$. For example, when M=Ag, X=Br and I, n-$Bu_4NAgBr_2$ and n-$Bu_4NAgI_2$ are prepared in this fashion. A similar procedure is described in Acta Chemica Scandinavica A28, (1974) p. 255.

The electrocrystallization is carried out in an H cell. A solution containing ET(1~mM) is prepared in a dry box and added to the anode compartment of the H cell. Similarly, a solution containing n-$Bu_4NMX_2$ (10~50 mM) is prepared and used to fill the cathode compartment and to equalize fluid levels on both sides. Cleaned and dried electrodes are inserted in the dry box. Crystals are grown at a constant current (0.5~2.0 $\mu$A) and constant temperature (22~±0.2° C.) environment.

Black lustrous compounds of (ET)$_2$MX$_2$ are harvested from anode after on to four weeks of growth. Detailed procedure for electrocrystallization is reported in Inorganic Syntheses, Vol. 24, Ed. J. M. Shreeve.

As with other superconductors, their use will include a layer of a conductive metal such as copper, silver and the like. Typically, each layer is of a thickness sufficient to carry the desired levels of current with 400–1000 Å being the superconductor and 1000–2000 Å for the conductive metal. The organic superconductor may be formed on the supporting metal by various types of deposition techniques such as precipitation and the like.

In testing for transition temperature, an inductive test is used to determine the temperature at which a resonance frequency is changed in an electrical coil. As reported in Physical Review B, Vol. 30, Number 5, (1984) pp. 2958–2960, rf penetration depth measurements are carried out to determine transition temperatures.

The rf penetration depth measurements are carried out on crystals cooled in a pumped liquid-helium (He$^4$ or He$^3$) cryostat surrounded by a superconducting magnet. The samples are contained in epoxy cylinders which could be inserted in an rf coil consisting of approximately three hundred turns of copper wire wound on an epoxy coil form measuring 3.75 mm in length and 2.05 mm in diameter. The coil is operated at frequencies of ~513 kHz. The rf penetration depth is measured at temperatures down to 0.44 K and in fields up to approximately 15 kOe. Temperatures are determined from the vapor pressure above the liquid He$^3$ or He$^4$. Superconductivity is detected by the increase in the resonant frequency of the rf coil caused by the exclusion of the rf field from the sample by persistent shielding currents. Because changes in the rf frequency of 1 part in 10$^5$ can be detected, this technique has a high sensitivity to superconductivity in the relatively small samples available for the experiment.

The following example is provided for illustrative purposes and is not intended to be restrictive as to the scope of the invention:

EXAMPLE I $\beta$-(ET)$_2$AuI$_2$ was prepared and tested for superconducting properties.

Lustrous black crystals of $\beta$-(ET)$_2$AuI$_2$, where ET is bis(ethylenedithio)tetrathiafulvalene as shown by the formula

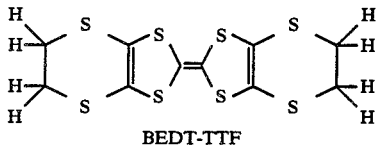

BEDT-TTF were grown by electrocrystallization by the use of 9.3 mg of ET (Strem Chemicals, Inc., 1.6 mM) as organic donor and 157 mg of n-Bu$_4$NAuI$_2$ (15.1 mM) as supporting electrolyte at 23° C. in a standard 15 mL capacity H-cell. The anion and the supporting electrolyte were prepared following the procedure involving the replacement of Br$^-$ by I$^-$ in n-Bu$_4$NAuBr$_2$ which is described in J. Chem. Soc. Dalton Trans. (1973) p. 1845. Its purity was confirmed by its mp (78°–79°) and elemental analysis. Anal. calcd. (found) for n-Bu$_4$NAuI$_2$: C, 27.72 (27.68); H, 5.23 (5.32); N, 2.02 (1.96); I, 36.61 (36.83). In the preparation, dry THF was used as solvent, and a 1.0 $\mu$A/cm$^2$ current density was applied. Crystal formation was observed within 24 hours and the fully grown distorted hexagons were harvested after about one week. The $\beta$-(ET)$_2$AuI$_2$ crystals are characterized by their room temperature peak-to-peak ESR linewidth of ~20 gauss.

Single crystal X-ray analysis revealed that $\beta$-(ET)$_2$AuI$_2$ is clearly isostructural [space group pT, $V_c$=845.2(3)Å$^3$, Z=1] with $\beta$-(ET)$_2$X, X=I$_3^-$ and IBr$_2^-$. The unit cell volumes for $\beta$-(ET)$_2$X, X=I$_3^-$ and IBr$_2^-$ are 855.9(2) Å$^3$ and 828.7(3) Å$^3$, respectively which indicates that, as expected, the (I-Au-I)$^-$ anion is of intermediate length between those of the two trihalide anions. Crystal structure studies show that the anion lengths are ~10.2 Å for the I$_3^-$ anion, ~9.3 Å for the IBr$_2^-$ anion, and ~9.4 Å for the AuI$_2^-$ anion. The structure consists of discrete layers of AuI$_2^-$ anions between which is sandwiched a "corrugated sheet network" of ET molecules with short (d$_{s...s}\leq$3.60 Å the van der Waals radius sum for S) interstack S . . . S interactions. The loosely packed stacking of the ET entities is characterized by intrastack S . . . S distances exceeding 3.60 Å.

The superconducting state in $\beta$-(ET)$_2$AuI$_2$ was detected by rf penetration depth measurements at ambient pressure and at various applied magnetic fields, similar to measurements previously reported for the I$_3^-$ and IBr$_2^-$ derivatives.

When tested for superconductivity, the sample of three relatively large crystals gave an apparent onset temperature for bulk superconductivity (T$_c$) of 4.97±0.06 K, which is a very high T$_c$ observed at ambient pressure for an organic superconductor. Measurements of the onset temperatures of the individual crystals gave T$_c$=3.93±0.04 K, 4.36±0.04 K, and 4.98±0.08 K, respectively.

The foregoing description of embodiments of the invention has been presented for purposes of illustration and description. It is not intended to be exhaustive or to limit the invention to the precise form disclosed, and obviously many modifications and variations are possible in light of the above teaching.

The embodiments of this invention in which an exclusive property or privilege is claimed are defined as follows:

1. A superconductor comprising a first layer of a compound with superconductor properties having the formula (ET)$_2$MX$_2$ where ET is bis(ethylenedithio)tetrathiafulvalene as shown by the formula

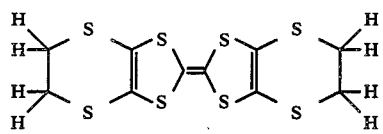

where M is a metal, X is a halide, and MX$_2$ is symmetrical; and a second supporting layer of a conductive metal.

2. The superconductor of claim 1 wherein M is Au, Ag, In, Tl, Rb, or Pd and X is I, Br or Cl.

3. The superconductor of claim 2 wherein the second layer is Cu.

4. The superconductor of claim 3 wherein M is Au and X is I.